United States Patent [19]

Nakamura et al.

[11] Patent Number: 5,777,938
[45] Date of Patent: Jul. 7, 1998

[54] SEMICONDUCTOR MEMORY DEVICE CAPABLE OF OUTPUTTING MULTI-BIT DATA USING A REDUCED NUMBER OF SENSE AMPLIFIERS

[75] Inventors: Kenichi Nakamura, Tokyo; Takahiro Tsuruto, Yokohama, both of Japan

[73] Assignee: Kabushki Kaisha Toshiba, Tokyo, Japan

[21] Appl. No.: 625,394

[22] Filed: Mar. 27, 1996

[30]  Foreign Application Priority Data

Mar. 28, 1995 [JP] Japan ................................ 7-069157

[51] Int. Cl.$^6$ .................................................. G11C 7/06
[52] U.S. Cl. ..................... 365/220; 365/221; 365/239; 365/230.03; 365/190; 365/189.05; 365/233.5; 365/189.11
[58] Field of Search ........................... 365/220, 221, 365/239, 230.03, 205, 190, 189.05, 233.5, 189.11

[56]  References Cited

U.S. PATENT DOCUMENTS 4,646,272  2/1987  Takasugi ........................... 365/233
5,375,097  12/1994  Reddy et al. ..................... 365/230.06

Primary Examiner—David C. Nelms
Assistant Examiner—Andrew Q. Tran
Attorney, Agent, or Firm—Loeb & Loeb LLP

[57]  ABSTRACT

A semiconductor memory device is disclosed which can read a plurality of bit units and which can suppress an increase in current consumption and in chip size even if the number of bits serving as a unit of reading is increased. The semiconductor memory device includes a memory cell array having memory cells arranged in a matrix form such that a plurality of columns are divided into a plurality of sections, a plurality of column selection circuits for selecting each of the columns of the memory cell array, a sense amplifier for sense-amplifying data transferred through the data lines, and a column selection control circuit for controlling the plurality of column selection circuits to select one of the plurality of sections of the memory cell array and one of the columns of the sections and to read bit data from the selected column, sequentially.

16 Claims, 5 Drawing Sheets

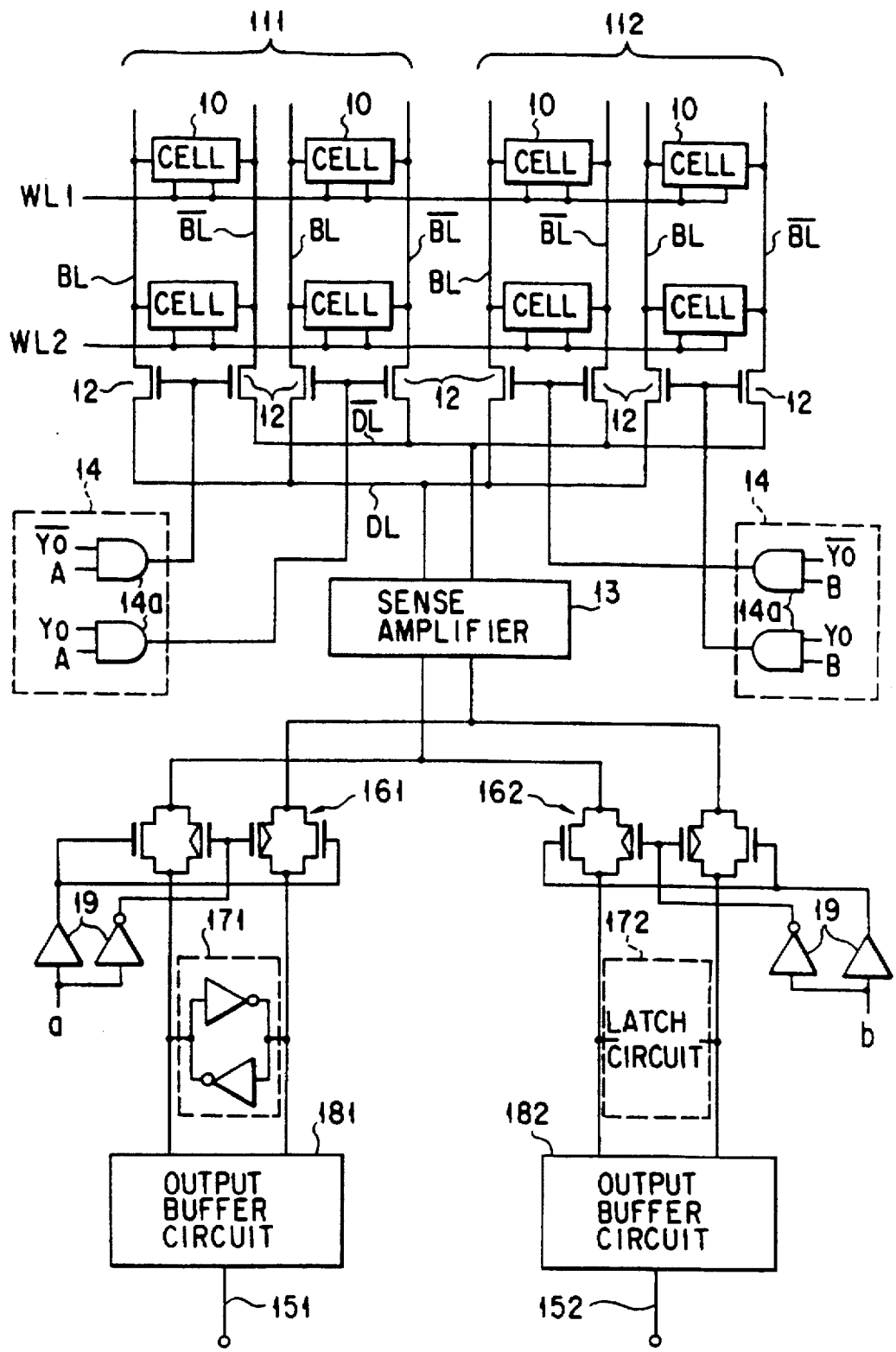
F I G. 1

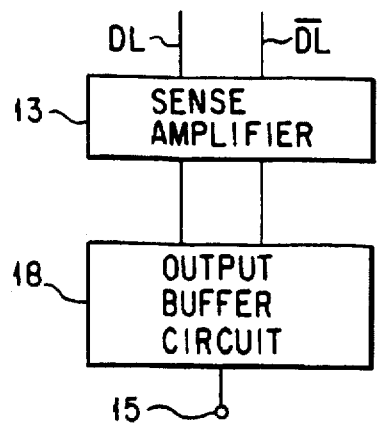
F I G. 3
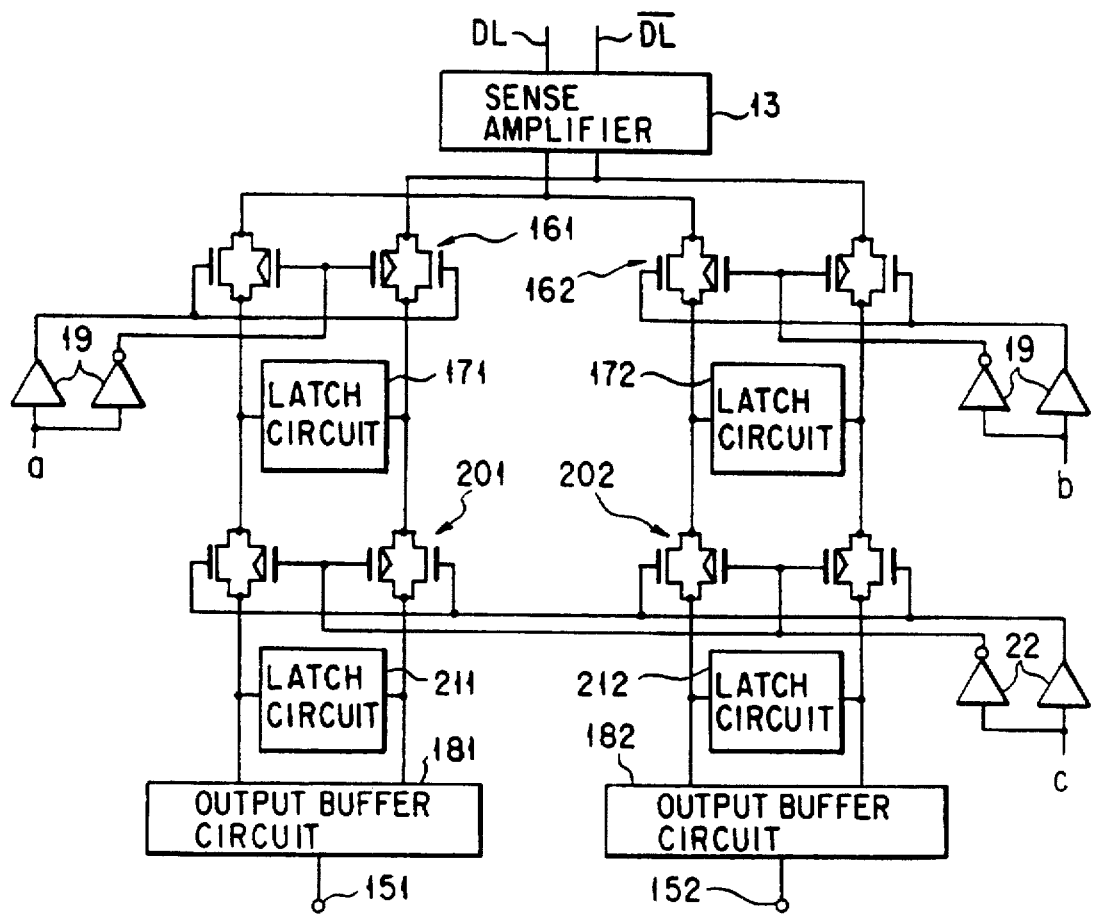
F I G. 4

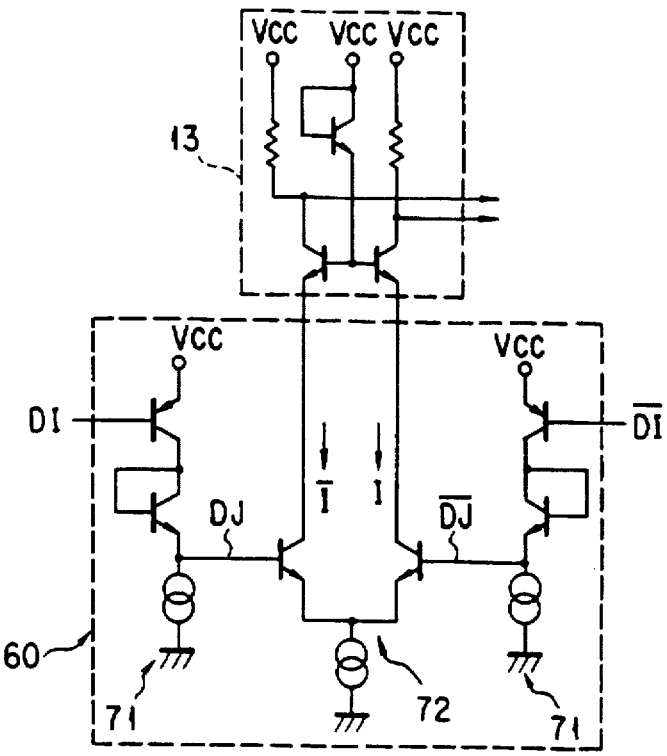
F I G. 7

SEMICONDUCTOR MEMORY DEVICE CAPABLE OF OUTPUTTING MULTI-BIT DATA USING A REDUCED NUMBER OF SENSE AMPLIFIERS

BACKGROUND OF THE INVENTION

1. Field of the Invention

The present invention relates to a semiconductor memory device, and more particularly to the improvement of a sense amplifier of a memory having a multi-bit structure, which is capable of reading a plurality of bit units.

2. Description of the Related Art

Conventionally, in a semiconductor memory device having a multi-bit structure (for example, SRAM:static type memory), which is capable of reading a plurality of bit units (for example, 8 bit), each of the sense amplifiers sense-amplifies only read data belonging to each bit among the read data of the plurality of bits. In other words, there are provided sense amplifiers, corresponding to the plurality of bits, in order to sense-amplify the respective data of the plurality of bits read out from a memory cell array.

FIG. 8 is a block diagram partially showing a read system of a conventional SRAM having the multi-bit structure.

In the block of the read system, first bit data, which is selectively read from bit lines of two columns of a first memory cell array 81, is sense-amplified by a first sense amplifier 82 to be output to a first output pin 84 through a first output buffer circuit 83. At the same time, second bit data, which is selectively read from bit lines of two columns of a second memory cell array 85, is sense-amplified by a second sense amplifier 86 to be output to a second output pin 88 through a second output buffer circuit 87.

However, the sense amplifiers 82 and 86, which correspond to the plurality of bits read from the memory cell arrays at the same time, are both needed. Due to this, if the number of bits serving as a unit of read data is increased, the operation current of the sense amplifiers is increased in accordance with the increase in the number of sense amplifiers, and current consumption of the memory chip is also increased. As a result, the pattern areas of the sense amplifiers 82 and 86 are increased, and the size of the memory chip is enlarged.

As mentioned above, in the conventional semiconductor memory which is capable of reading a plurality of bit units, the following problems occur.

If the number of bits serving as a unit of read data is increased, the operation current of the sense amplifiers is increased, and current consumption of the memory chip is also increased. As a result, the pattern areas of the sense amplifiers are increased, and the size of the memory chip is enlarged.

SUMMARY OF THE INVENTION

An object of the present invention is to provide a semiconductor memory device which can read a plurality of bit units and which can suppress increases in current consumption and in chip size even if the number of bits serving as a unit of reading is increased.

According to the present invention, there is provided a semiconductor memory device comprising a memory cell array having memory cells (10) arranged in a matrix form such that a plurality of columns are divided into a plurality of sections (111, 112); a plurality of column selection circuits (12) for selecting each of the columns of the memory cell array; data lines (DL, /DL) for transferring data read from the memory cell array through the plurality of column selection circuits; a sense amplifier (13) for sense-amplifying data transferred through the data lines; and a column selection control circuit (14) for controlling the plurality of column selection circuits to select one of the plurality of sections of the memory cell array and one of the columns of the sections and to read bit data from the selected column, sequentially.

In the memory cell array having the plurality of sections which are accessed simultaneously, the column selection control circuit controls the plurality of column selection circuits to select each of the plurality of sections of the memory cell array and each of columns of the plurality of the sections and to read bit data from the selected column, sequentially.

Thus, data of the plurality of bits sequentially read to the data lines from the plurality of sections through the plurality of column selection circuits is sequentially sense-amplified by one sense amplifier.

By suitably controlling the read timing, data of the plurality of bits sense-amplified by one sense amplifier can be output through the output buffers simultaneously or substantially simultaneously.

Therefore, according to the present invention, the plurality of bit units can be read without delay as compared with the conventional SRAM. In addition, the number of the sense amplifiers, necessary to sense-amplify data of the plurality of bits read to the data lines one bit by one bit from the plurality of the sections of the memory cell array through the column selection circuits is one. Due to this, it is possible to suppress the increase in current consumption of the memory chip and the increase in the size of the memory chip even if the number of bits serving as a unit of reading is increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram partially showing a reading system of an SRAM of a first embodiment of the present invention;

FIG. 3 is a block diagram showing a modification of the SRAM of FIG. 1;

FIG. 4 is a block diagram showing another modification of the SRAM of FIG. 1;

FIG. 7 is a circuit diagram showing an example of a data line signal conversion circuit of FIG. 6.

DETAILED DESCRIPTION OF PREFERRED EMBODIMENTS

Figure 2:
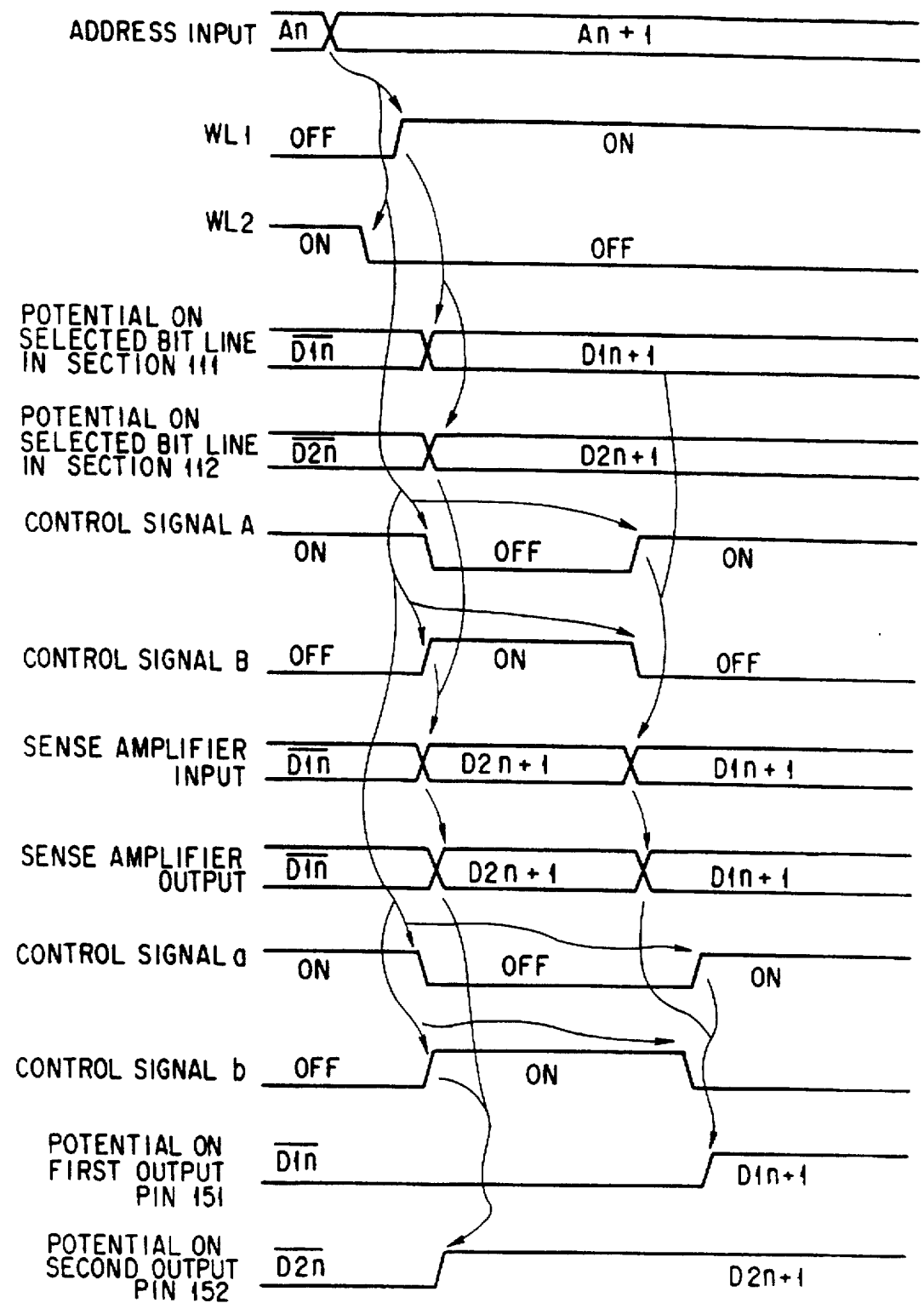
FIG. 2 is a timing waveform showing an operation of the SRAM of FIG. 1.

Preferred embodiments of the present invention will be specifically explained with reference to the drawings.

FIG. 1 is a block diagram partially showing a reading system of an SRAM having a multi-bit structure according to a first embodiment of the present invention.

The SRAM comprises a memory cell array, word lines WL1, W2, a pair of bit lines (BL,/BL), a plurality of column selection circuits (transfer gates) 12, a pair of data lines (DL, /DL), a sense amplifier 13, and a column selection control circuit 14.

The memory cell array has a plurality of sections (for example, two sections 111, 112 in this embodiment) in which SRAM cells 10 are arranged in a matrix form and a plurality of columns (two columns in this embodiment) are accessed simultaneously. The word lines WL1 and WL2 (two rows are illustratively shown in this embodiment) are connected to the SRAM cells of the respective rows of the memory cell array. The bit line pairs (BL, /BL) are connected to the SRAM cells of the respective columns of the memory cell array. The column selection circuits (transfer gates) 12 select the respective columns of the memory cell array. The data lines (DL, /DL) transfer data read from the memory cell array through the column selection circuits 12. The sense amplifier 13 sense-amplifies data transferred through the data lines (DL, /DL). The column selection control circuit 14 controls the plurality of the column selection circuits 12 to select each of the plurality of sections of the memory cell array and each of columns of the sections and to read bit data from the selected column, sequentially.

According to the above embodiment, the column selection control circuit 14 comprises four two-input AND gates 14a for alternatively selecting four columns in accordance with the combinations of complementary column address signals YO, /YO, and section selection control signals A, B. In this case, as the control signals A and B, input signals sent from another portion of the SRAM may be used. For example, a change of an address input signal can be detected a portion of the SRAM to cause the control signals to be generated.

Moreover, according to the above embodiment, the output side of the sense amplifier 13 is structured to be branched so as to correspond to a plurality of bits (two bits in this embodiment) such that read data is transferred to each of the output pins 151 and 152 corresponding to two bits.

For example, corresponding first switch circuits (e.g., CMOS transfer gates) 161, 162, first latch circuits 171 and 172, and output buffer circuits 181 and 182 are respectively inserted between the sense amplifier 13 and the output pins 151 and 152 corresponding to two bits in order.

Moreover, in order to control the first CMOS transfer gates 161, 162 corresponding to two bits to be alternatively turned on in order based on control signals a and b, an inverter 19 is provided between each of the control signals a and b and a control gate of each of the CMOS transfer gates 161 and 162. In this case, as the control signals a and b, input signals sent from another portion of the SRAM may be used. For example, the change of the address input signal, may be detected by a portion of the SRAM, to cause the control signals to be generated.

The following will explain the outline of the operation of the SRAM of FIG. 1.

In the memory cell array having two sections which are accessed simultaneously, the column selection control circuit 14 controls the plurality of the column selection circuits 12 to select each of two sections of the memory cell array and each of the columns of the sections and to read bit data from the selected column, sequentially.

Thereby, data sequentially read to the data lines (DL,/DL) from each of two sections through the column selection circuits 12 is sequentially sense-amplified by one sense amplifier 13. The first transfer gates 161 and 162 corresponding to two bits are controlled to be alternatively turned on. Thereby, data of each bit of two bit data is alternatively latched by the first latch circuits 171 and 172.

Then, data of each bit of two bit data, which is alternatively latched by the first latch circuits 171 and 172, is alternatively output from the output Pins 151 and 152 corresponding to two bits through the output buffer circuits 181 and 182 corresponding to two bits.

FIG. 2 is a timing waveform showing the operation of the SRAM of FIG. 1.

The following will explain the operation of the SRAM of the first embodiment of the present invention with reference to the timing waveform of FIG. 2.

FIG. 2 shows the timing waveform in the following case.

When first bit data /D1n is output from the output pin 151 of the first bit and second bit data /D2n is output from the output pin 152 of the second bit, the address input signal changes, so as to cause the word line WL1 to be changed from OFF to ON, and the word line WL2 to be changed from ON to OFF. In this case, the column address signals YO, and /YO are fixed to be "H" and "L" level, respectively, and the change of the address input signal is detected by the interior of the SRAM, thereby the control signals A and B may be generated.

When the address input signal changes and the selection address is changed from An to An+1, the word line WL1 is changed from OFF to ON, and the word line WL2 is changed from ON to OFF, so data on the bit line belonging to the first bit is changed from /D1n to D1n+1, and data on the bit line belonging to the second bit is changed from /D2n to D2n+1.

Then, if the control signals A and a are temporarily turned off and the control signals B and b are temporarily turned on, input data and output data of the sense amplifier 13 are changed to /D1n→D2n+1→D1n+1, and output data D1n+1 is latched by the first latch circuit 171 belonging to the first bit, and output data D2n+1 is latched by the second latch circuit 172. Thereby, second bit data to be output from the output pin 152 of the second bit is changed from D2n to D2n+1, and first bit data to be output from the output pin 151 of the first second bit is changed from /D1n to D1n+1.

In other words, according to the SRAM of the first embodiment, the plurality of bit units can be read without delay as compared with the conventional SRAM. In addition, the number of sense amplifiers 13, necessary to sense-amplify data of the plurality of bits read to the data lines one bit by one bit from the plurality of the sections of the memory cell array through the column selection circuits 12 is one. Due to this, it is possible to suppress the increase in current consumption of the memory chip and the increase in the size of the memory chip.

FIG. 3 is a block diagram partially showing a modification of the SRAM of FIG. 1.

The SRAM of FIG. 3 is different from that of FIG. 1 in that the output side of the sense amplifier 13 is not branched so as to correspond to two bits. Instead, the output of the sense amplifier 13 is transferred to an output pin 15 corresponding to one bit through one output buffer circuit 18. The other structure of the SRAM of FIG. 3 is the same as that of the SRAM of FIG. 1.

As compared with the operation of the SRAM of FIG. 1, according to the above-structured SRAM of FIG. 3, the difference is that two bit data, which is sequentially sense-amplified by one sense amplifier 13, is output from the same output pin 15 sequentially, but substantially at the same time.

However, the SRAM of FIG. 3 can obtain substantially the same technical advantage as that of FIG. 1 without reducing the reading speed. In addition, a simplification of the circuit structure and a reduction in the number of output pins can be made. Also, the chip size can be further reduced.

FIG. 4 is a block diagram showing another modification of the SRAM of FIG. 1.

The SRAM of FIG. 4 is different from that of FIG. 1 in that second switch circuits (for example, CMOS transfer gates) 201 and 202, and second latch circuits 211 and 212 are inserted between the first latch circuits 161 and 162 corresponding to two bits and the output buffer circuits 181 and 182, respectively. Moreover, in order to control the second CMOS transfer gates 201, 202 corresponding to two bits to be alternatively turned on simultaneously based on a control signal c, an inverter 22 is provided between the control signal c and a control gate of each of the CMOS transfer gates 201 and 202. Regarding the other structure, since the SRAM of FIG. 4 is the same as that of FIG. 1, the same reference numerals are added to the common portions.

In this case, as the control signal c, an input signal sent from another portion of the SRAM may be used. For example, the change of the address input signal may be detected by a portion of the SRAM to cause the control signal to be generated.

Figure 5:
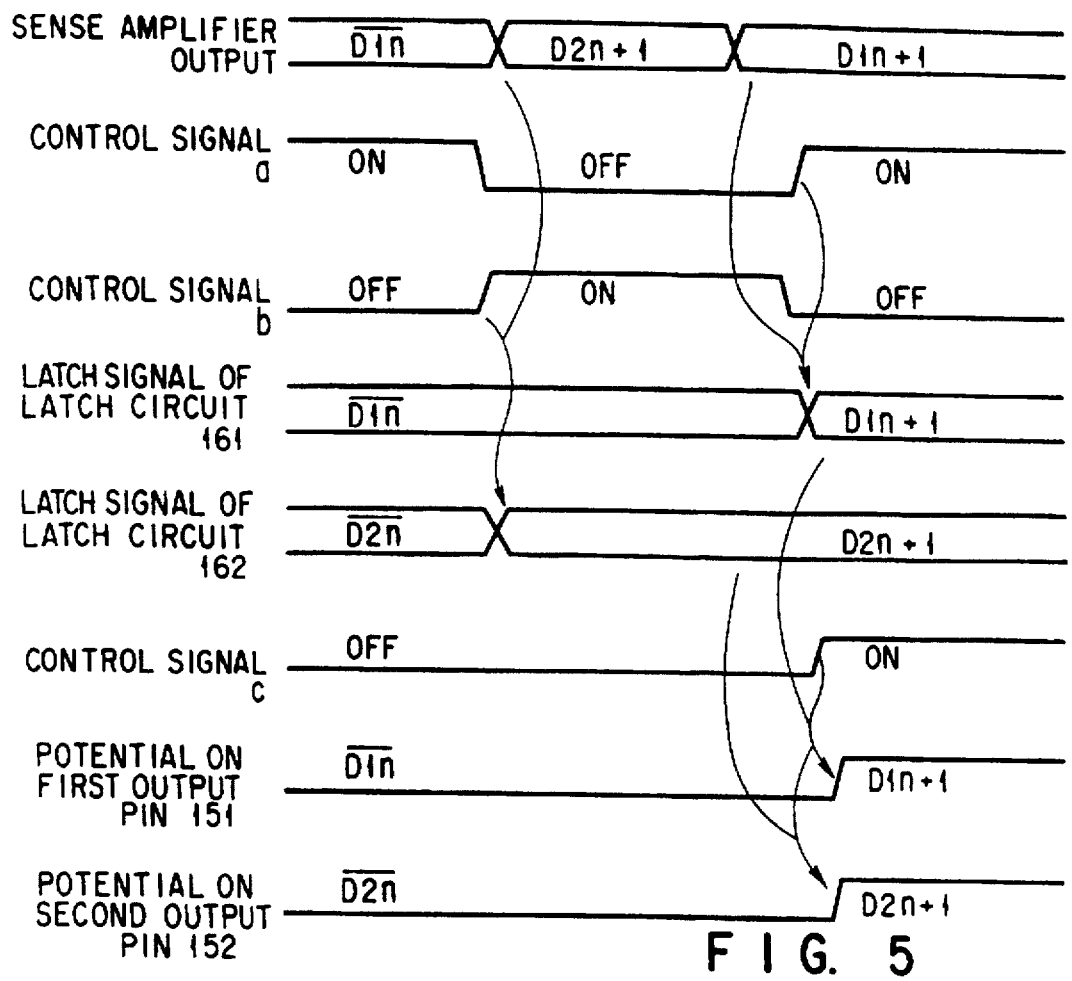
FIG. 5 is a timing waveform showing an operation of the SRAM of FIG. 4.

FIG. 5 is a timing waveform showing a signal waveform of each portion of a back stage side of the sense amplifier in the operation of the SRAM of FIG. 4.

The operation of the SRAM of FIG. 4 is different from that of FIG. 1 in the back stage of the sense amplifier. Specifically, as shown in the timing waveform view of FIG. 5, the second transfer gates 201 and 202, which correspond to two bits, are controlled to be turned on simultaneously. Thereby, two bit data, which is sequentially latched by the respective first latch circuits 161 and 162 corresponding to two bits, is simultaneously latched by the second latch circuits 211 and 212, respectively.

As a result, the SRAM of FIG. 4 can obtain substantially the same technical advantage as that of FIG. 1. In addition, there can be obtained advantages in that two bit data can be simultaneously output from the output pins 151 and 152 corresponding to two bits through the output buffer circuits 181 and 182 corresponding to two bits; that is, the reading speed for the two bits is the same.

Furthermore, in a Bi-CMOS type memory, there is a case in which a data line signal conversion circuit is provided in the front stage of the sense amplifier to convert a potential on the data lines or convert the signal of the data lines from a voltage mode to a current mode.

Figure 6:
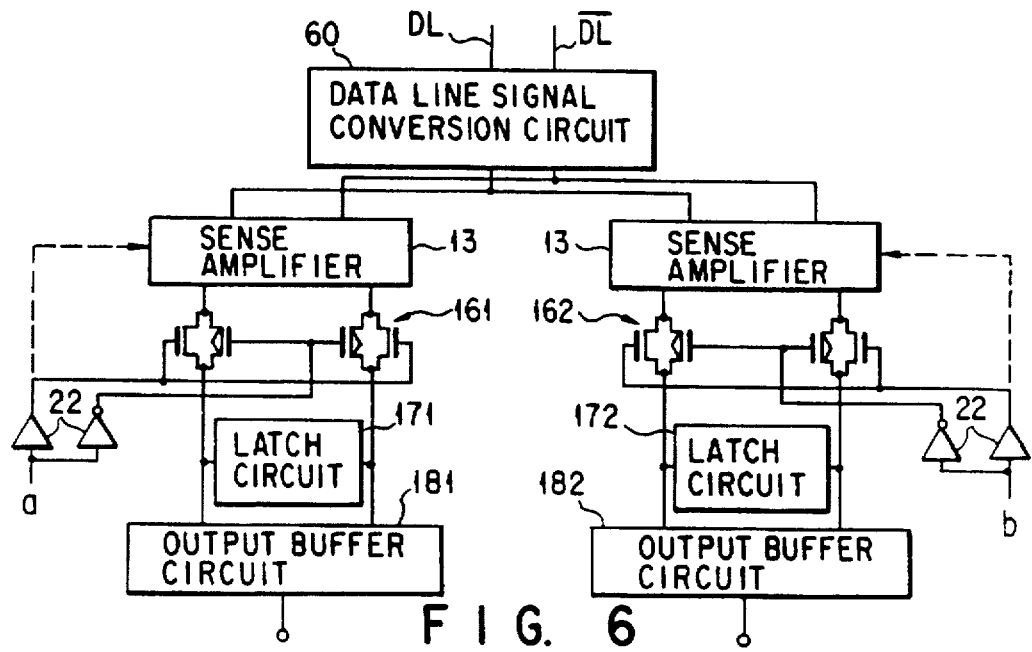
FIG. 6 is a block diagram partially showing a reading system of an SRAM of a second embodiment of the present invention.
Figure 8:
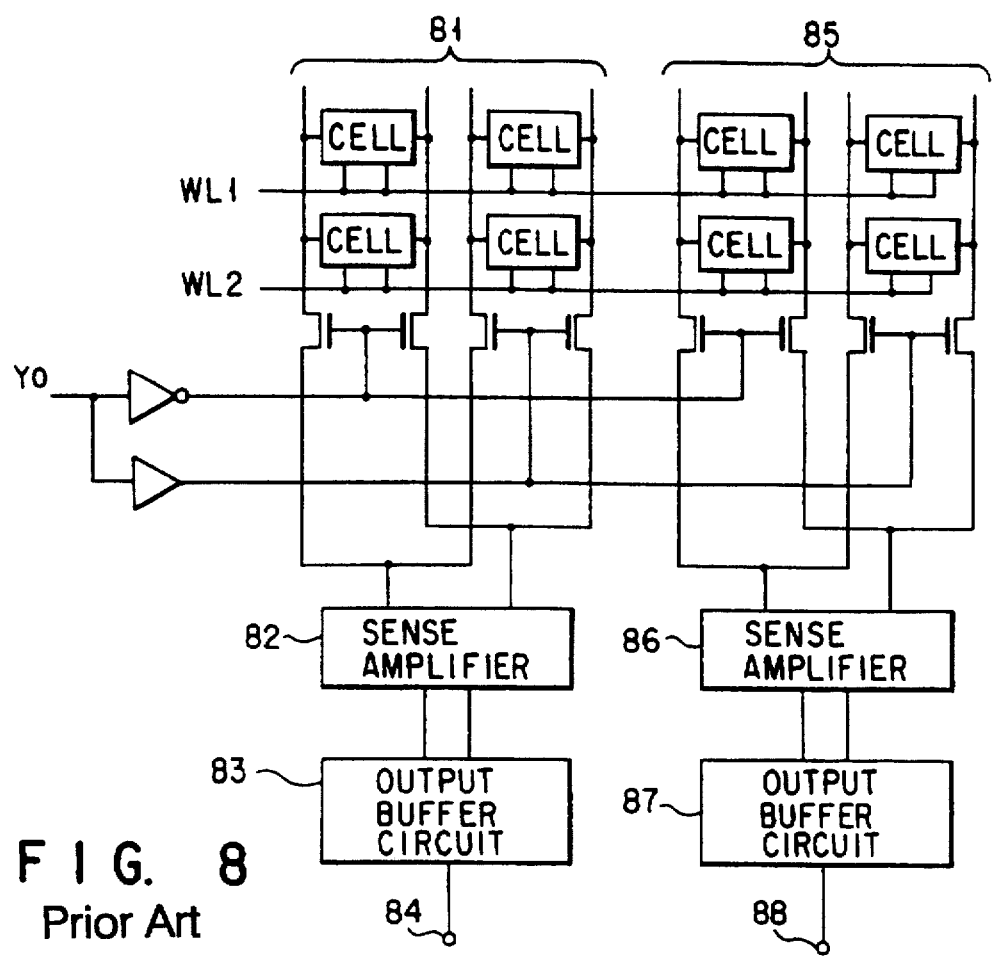
FIG. 8 is a block diagram partially showing a reading system of a conventional SRAM.

FIG. 6 is a block diagram partially showing a reading system of an SRAM of a second embodiment of the present invention having the above-mentioned data line signal conversion circuit.

The SRAM of FIG. 6 is different from that of FIG. 1 in that the sense amplifier 13 is provided to correspond to each of the two bits. Additionally one data line signal conversion circuit 60 is provided between the data lines (DL, /DL) and the two sense amplifiers 13. Since the other structure of the SRAM of FIG. 6 is the same as that of FIG. 1, the same reference numerals are added to the common portions.

FIG. 7 is a specific circuit diagram of the data line signal conversion circuit 60 of FIG. 6.

In the data line signal conversion circuit 60, the potential of each of data signals DI and /DI of the data lines (DL, /DL) is reduced by, for example, 0.8V by a bipolar type level shift circuit 71. Thereafter, the slight potential difference between the level-shifted data DJ, and /DJ is converted to a large current difference (between I and /I) by a bipolar type voltage/current conversion circuit 72. Thereby, the current (I, /I) can be sense-amplified by the sense amplifier 13, and converted to the large potential difference.

According to the SRAM of FIG. 6, the same technical advantage as the SRAM of FIG. 1 can be obtained. Moreover, since one data line signal conversion circuit 60 is shared by the plurality of sections of the memory cell array, the increase in current consumption of the memory chip and the increase in chip size can be suppressed.

Moreover, as shown by the dotted lines of FIG. 6, the sense amplifier 13 may be controlled in accordance with the control of the first transfer gates 161 and 162 by the output signal of the inverter 22 for controlling the first transfer gates 161 and 162. In this case, for example, the sense amplifier 13 is controlled to be turned off while the first transfer gates 161 and 162 are set to be in an OFF state, and the sense amplifier 13 is controlled to be turned on while the first transfer gates 161 and 162 are set to be in an ON state. Thereby, the increase in the current consumption of the sense amplifier 13 can be suppressed.

The above embodiments explain cases in which the present invention is applied to an SRAM. However, the present invention can be applied to other semiconductor memories having the multi-bit structure, which are capable of reading a plurality of bit units.

As mentioned above, according to the present invention, there can be realized a semiconductor memory device which can read a plurality of bit units and which can suppress an increase in current consumption of a chip and in chip size even if the number of bits serving as a unit of reading is increased.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:

a memory cell array having memory cells arranged in a matrix form such that a plurality of columns are divided into a plurality of column sections;

a plurality of column selection circuits coupled to the plurality of column sections, each of the column selection circuits for selecting one of said columns of a corresponding column section when that column selection circuit is enabled by a control signal;

a data line coupled in common to two or more of the column sections such that the data line is selectively connected to the columns of said two or more column sections, for transferring data read from one of said memory cells that is connected to the column selected by the column selection circuit that is enabled by the control signal;

a sense amplifier coupled to said data line, for sense-amplifying data transferred through said data line; and a control signal generating circuit generating the control signal to enable one of the column selection circuits.

2. The semiconductor memory device according to claim 1, further comprising:

output pins corresponding to a plurality of bits, for outputting data that is sequentially sense-amplified by said sense amplifier, the output data corresponding to said plurality of bits;

first switch circuits provided between said sense amplifier and said output pins;

first latch circuits provided between said sense amplifier and said output pins;

output buffer circuits provided between said sense amplifier and said output pins; and a first control circuit for controlling said first switch circuits so as to alternatively turn on said first switch circuits in accordance with first control signals.

3. The semiconductor memory device according to claim 2, further comprising:

second switch circuits provided between said first latch circuits and said output buffer circuits;

second latch circuits provided between said first latch circuits and said output buffer circuits; and a second control circuit for controlling said second switch circuits so as to simultaneously turn on said second switch circuits in accordance with a second control signal.

4. The semiconductor memory device according to claim 1, further comprising:

an output pin corresponding to one bit for sequentially outputting data that is sequentially sense-amplified by said sense amplifier, the output data corresponding to a plurality of bits; and an output buffer circuit provided between said sense amplifier and said output pin.

5. The semiconductor memory device according to claim 1, wherein the number of sense amplifiers is less than the number of columns in the memory cell array.

6. The semiconductor memory device according to claim 1, wherein the number of sense amplifiers is less than the number of column sections of the memory cell array.

7. The semiconductor memory device according to claim 1, wherein one sense amplifier is provided for all of the columns of the memory cell array.

8. The semiconductor memory device according to claim 1, wherein the data line is connected between the sense amplifier and each of the columns of the memory cell array so as to selectively connect the sense amplifier to one of the columns of the memory cell array.

9. The semiconductor memory device according to claim 1, wherein the data line is connected between the sense amplifier and at least one of the columns in one of the column sections, and the data line is also connected between the sense amplifier and at least one of the columns in another of the column sections so as to selectively couple the sense amplifier to columns in at least two of the column sections.

10. A semiconductor memory device comprising:

a memory cell array having memory cells arranged in a matrix form such that a plurality of columns are divided into a plurality of sections;

a plurality of column selection circuits coupled to the sections of the memory cell array, for selecting each of said columns of said memory cell array;

data lines coupled to the sections of the memory cell array, for transferring data read from said memory cell array using said plurality of column selection circuits;

a sense amplifier coupled to the data lines, for sense-amplifying data transferred through said data lines;

a column selection control circuit coupled to the column selection circuits, for controlling said column selection circuits so as to select one of the sections of the memory cell array and one of the columns of said sections and to read bit data from said selected column;

output pins corresponding to a plurality of bits, for outputting data that is sequentially sense-amplified by said sense amplifier, the output data corresponding to the plurality of bits;

first switch circuits provided between said sense amplifier and said output pins;

first latch circuits provided between said sense amplifier and said output pins;

output buffer circuits provided between said sense amplifier and said output pins;

a first control circuit controlling said first switch circuits so as to alternatively turn on said first switch circuits in accordance with first control signals;

second switch circuits provided between said first latch circuits and said output buffer circuits;

second latch circuits provided between said first latch circuits and said output buffer circuits; and a second control circuit controlling said second switch circuits so as to simultaneously turn on said second switch circuits in accordance with a second control signal.

11. A semiconductor memory device comprising:

a memory cell array having memory cells arranged in a matrix form such that a plurality of columns are divided into a plurality of sections;

a plurality of column selection circuits coupled to the sections of the memory cell array, for selecting each of said columns of said memory cell array;

data lines coupled to the sections of the memory cell array, for transferring data read from said memory cell array using said plurality of column selection circuits;

a data line signal conversion circuit coupled to said data lines, for converting a potential of a signal, which corresponds to data, transferred through said data lines to a different potential, or for converting the signal transferred through said data lines from a voltage mode to a current mode; and a column selection control circuit coupled to the column selection circuits, for controlling said column selection circuits so as to select one of the sections of said memory cell array and one of the columns of said sections and to read bit data from said selected column.

12. A semiconductor memory device comprising:

a memory cell array having memory cells arranged in a matrix form such that a plurality of columns are divided into a plurality of column sections;

a plurality of column selection circuits coupled to the plurality of column sections, each of the column selection circuits for selecting one of said columns of a corresponding column section when that column selection circuit is enabled by a control signal;

a data line coupled in common to two or more of the column sections such that the data line is selectively connected to the columns of said two or more column sections, for transferring data read from one of said memory cells that is connected to the column selected by the column selection circuit that is enabled by the control signal;

a data line signal conversion circuit coupled to said data line, for converting a potential of a signal, which corresponds to data, transferred through said data line to a different potential, or for converting the signal transferred through said data line from a voltage mode to a current mode; and a control signal generating circuit generating the control signal to enable one of the column selection circuits.

13. The semiconductor memory device according to claim 12, wherein the number of data line signal conversion circuits is less than the number of column sections of the memory cell array.

14. The semiconductor memory device according to claim 12, wherein one data line signal conversion circuit is provided for all of the columns of the memory cell array.

15. The semiconductor memory device according to claim 12, wherein the data line is connected between the data line signal conversion circuit and each of the columns of the memory cell array so as to selectively connect the data line signal conversion circuit to one of the columns of the memory cell array.

16. The semiconductor memory device according to claim 12, wherein the data line is connected between the data line signal conversion circuit and at least one of the columns in one of the column sections, and the data line is also connected between the data line signal conversion circuit and at least one of the columns in another of the column sections so as to selectively couple the data line signal conversion circuit to columns in at least two of the column sections.

* * * * *